United States Patent [19]

Gaskill

[11] Patent Number: 5,065,423

[45] Date of Patent: Nov. 12, 1991

[54] PAGING SYSTEM WITH REGISTRATION MODE

[75] Inventor: Garold B. Gaskill, Tualatin, Oreg.

[73] Assignee: AT&E Corporation, San Francisco, Calif.

[21] Appl. No.: 435,313

[22] Filed: Nov. 13, 1989

Related U.S. Application Data

[63] Continuation-in-part of Ser. No. 367,207, Jun. 16, 1989, and a continuation-in-part of Ser. No. 367,014, Jun. 16, 1989, and a continuation-in-part of Ser. No. 430,457, Oct. 31, 1989, and a continuation-in-part of Ser. No. 352,635, May 12, 1989, Pat. No. 4,897,835, said Ser. No. 352,635, continuation of Ser. No. 121,139, Nov. 16, 1987, is a continuation-in-part of Ser. No. 802,844, Nov. 27, 1985, Pat. No. 4,713,808.

[51] Int. Cl.[5] ............... H04M 11/00; G08B 5/22; H04J 3/24

[52] U.S. Cl. ............... 379/57; 340/825.44; 370/941; 379/56

[58] Field of Search ............ 379/57, 58, 61, 63, 379/56; 455/38, 154, 186; 340/825.44, 825.48; 370/94.1

[56] References Cited

U.S. PATENT DOCUMENTS

| | | | |
|---|---|---|---|
| 4,422,071 | 12/1983 | deGraff | 340/825.44 |
| 4,518,961 | 5/1985 | Davis et al. | 340/825.44 |
| 4,713,808 | 12/1987 | Gaskill et al. | 370/94.1 |
| 4,720,710 | 1/1988 | Akahori et al. | 340/825.44 |
| 4,761,806 | 8/1988 | Toki | 379/61 |
| 4,849,750 | 7/1989 | Andros et al. | 340/825.44 |
| 4,868,561 | 9/1989 | Davis | 340/825.44 |
| 4,881,073 | 11/1989 | Andros et al. | 340/825.44 |
| 4,897,835 | 7/1990 | Gaskill et al. | 370/94.1 |

OTHER PUBLICATIONS

Motorola "Dyne Tac 6000X" Universal Mobile Telephone 1984.

Primary Examiner—Jin F. Ng
Assistant Examiner—William Cumming
Attorney, Agent, or Firm—Elmer W. Galbi

[57] ABSTRACT

The user of a new pager places it into "registration mode" by commands entered through the pager's user interface. In registration mode, the pager displays previously stored identification code and begins rapidly searching through a list of candidate paging channels. The user then telephones the paging system clearinghouse and provides the identification code. Upon receiving this information, the paging system broadcasts an initialization message addressed to the new pager. Included in the message may be initialization data, such as a list of alternative frequencies on which the paging data may be found. The pager quickly receives this message (due to its rapid searching operation) and stores any initialization data in data registers for future reference. The pager then displays a message to the user confirming the pager's proper operation.

5 Claims, 3 Drawing Sheets

PAGING SYSTEM WITH REGISTRATION MODE

RELATED APPLICATION DATA

The present application is a continuation-in-part of copending applications:
Ser. No. 07/367,207, filed June 16, 1989, now pending
Ser. No. 07/367,014, filed June 16, 1989, now pending
Ser. No. 07/430,457, filed Oct. 31, 1989 now pending, and
Ser. No. 07/352,635, filed May 12, 1989 (now U.S. Pat. No. 4,897,835.

Application Ser. No. 07/352,635 is a continuation of abandoned application Ser. No. 07/121,139, filed Nov. 16, 1987, now abandoned which in turn was a continuation-in-part of application Ser. No. 06/802,844 filed Nov. 27, 1985 now U.S. Pat. No. 4,713,808. All of these related cases are assigned to the present assignee and are incorporated herein by reference.

FIELD OF THE INVENTION

The present invention relates to paging systems, and more particularly the present invention relates to the registration of new pagers in a paging system.

BACKGROUND AND SUMMARY OF THE INVENTION

In conventional paging systems, each paging receiver is assigned a unique address or identification number. The address or identification number is stored in a non-volatile memory or the number is wired into the pager's circuitry. Before a new paging receiver can be used in a paging system, the paging system must be informed of the receiver's identification code. That is, when an individual buys or leases a pager the paging system's clearinghouse (a computerized facility that controls operation of the paging system) must be programmed to associate the particular individual with the particular address stored in the pager that the individual has acquired.

The present invention is directed to pagers which are designed for widespread use and for mass distribution. Furthermore, the present invention is designed for use in a pager which normally only has a short active period followed by a relatively long inactive period (for example the pager may only be active for 35 milliseconds every 1.875 minutes). Such a pager could be registered in substantially the same way that prior art pagers are now being registered; however, if this were done, a user might have to wait a substantial period of time (in the neighborhood of 1.875 minutes) before receiving an acknowledgement on the pager indicating that the registration operation had been completed and that the pager had received a message from the clearinghouse. From a human factors point of view this delay, while seemingly short is not acceptable.

With such pagers a simple and fast registration procedure is required. It is an object of the present invention to provide a pager and a paging system which can facilitate a simple and fast registration procedure.

The present invention therefore provides the pager with a special registration mode.

SUMMARY OF THE INVENTION

With the present invention, the pager can be placed into a "registration mode" by commands entered through the pager's user interface. In registration mode, the pager recalls its identification address from memory and displays the address on the pagers display. When placed in registration mode the pager begins to rapidly scan through the entire frequency spectrum with which the pager is designed to operate. After placing the pager in registration mode, the user telephones the paging system clearinghouse and provides the identification address displayed by the pager to the clearinghouse. Additional information, such as a credit card number for billing purposes may also be provided in this fashion.

After receiving the information from the user via telephone, the paging system broadcasts over the radio station an initialization message addressed to the new pager. Included in the initialization message may be initialization data, such as a list of alternative frequencies on which the paging data may be found. The pager quickly receives this message, (due to the fact that searching or scanning is at a very rapid rate) and stores initialization data in memory for future reference. The pager then displays a message to the user confirming the pager's proper operation.

The foregoing and additional features and advantages of the present invention will be more readily apparent from the following detailed description thereof, which proceeds with reference to the accompanying drawings.

DETAILED DESCRIPTION OF THE INVENTION

The present invention will be described herein with reference to the paging system (the "Gaskill" system) described in U.S. Pat. No. 4,713,808 and in allowed application Ser. No. 07/352,635. However, it will be recognized that the invention is not limited in its application to this particular system.

Figure 1:
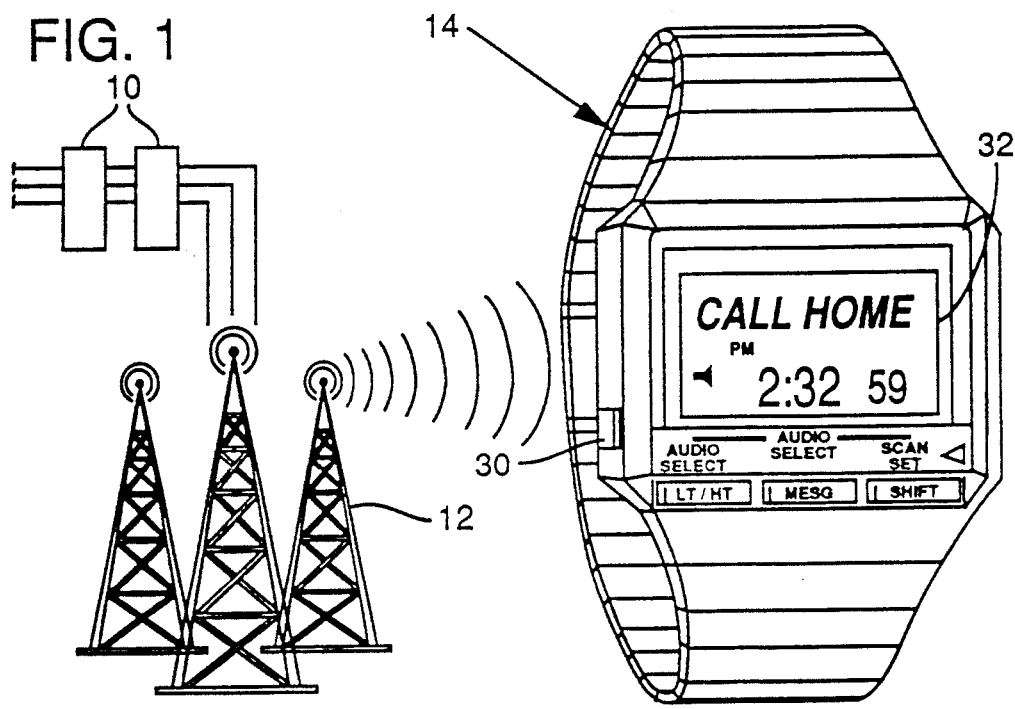
FIG. 1 is a schematic block diagram illustrating a paging system that may use the present invention.

As shown in FIG. 1, the Gaskill system includes clearinghouses 10, broadcasting facilities 12 and wristwatch paging receivers 14. The wristwatch paging receivers 14 are designed to be worn by users and to receive paging messages broadcast by the broadcast facilities. The clearinghouses 10 can be fully automated centralized facilities which accept messages, validate customer identification, determine message destinations and route messages to the appropriate broadcast facilities for transmission. Callers to such an automated system would dial a local clearinghouse telephone number and hear voice prompts that guide them through a simple process for sending messages. However, for the purpose of the present invention, the clearinghouse need not be automated and the clearinghouse could be maned by an operator who would take the telephone call for the person using the pager and manually enter the data into the system.

The broadcast facilities 12 are conventional FM broadcast stations that carry paging data on their subcarriers. Multiple stations are used for transmission in a given area. Providing signals from a diversity of stations combined with repeated transmission insures that the paging subscribers receive their messages with a high degree of reliability. As described in greater detail in the above-referenced parent applications, local channel lists are transmitted to the pagers and provide a list of alternative channels to which the pager can refer if the channel presently being received becomes unreliable.

Figure 2:
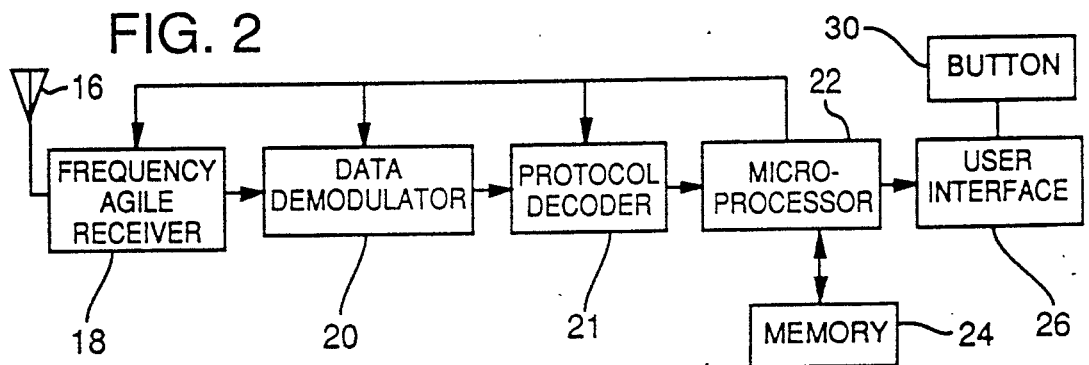
FIG. 2 is a schematic block diagram illustrating a wristwatch paging receiver used in the system of FIG. 1.
Figure 3:
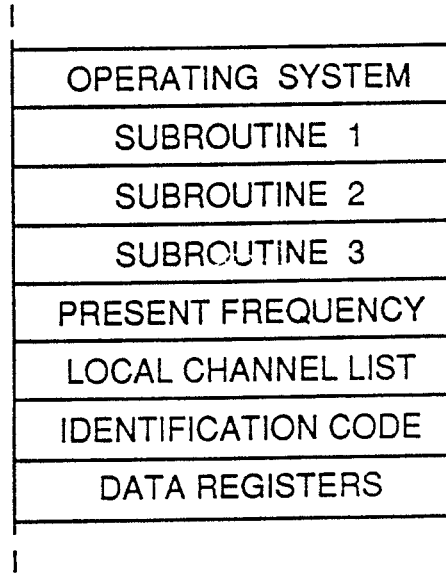
FIG. 3 is a block diagram illustrating the partial contents of a microprocessor memory used in the paging receiver of FIG. 2.

A block diagram of such a receiver 14 is shown in FIG. 2. The receiver basically includes an antenna 16, a frequency agile receiver 18, a data demodulator 20, a protocol decoder 21, a microprocessor 22 (with associated memory 24 including data registers) and a user interface 26. Memory 24 contains various data and programs relating to operation of the watch, such as a subroutine for finding a new station, a subroutine for obtaining a local channel list, a datum indicative of the frequency to which the watch is presently tuned, and a local channel list. FIG. 3 illustrates some of the contents of this memory 24.

The antenna 16 receives radio frequency signals in the desired reception band (here 88 to 108 MHz) and couples them to the frequency agile receiver 18. The frequency agile receiver 18 processes the RF signals from the antenna and produces baseband output signals corresponding to a desired FM station within the reception band. The paging data is carried on a subcarrier of the FM signal (i.e. an SCA signal). This SCA paging data is detected by the data demodulator 20, decoded by the protocol decoder 21 and is provided to the microprocessor 22 for processing. The microprocessor 22 drives the user interface 26 to alert the user of paging messages.

In the following discussion the terms "search", "scan", "mode" and "state" are used in accordance with the following definitions:

- A "search" is an operation in which the receiver sequentially checks a plurality of previously identified channels (i.e. channels that have been identified by a local channel list) for a desired signal.
- A "scan," in contrast, is an operation in which the receiver tunes through all possible frequencies within its range of operation looking for a signal which the receiver can identify as having the protocol used by the paging system.
- A "state" is one particular condition of the pager.
- A "mode" is a sequence of states.

Figure 4:
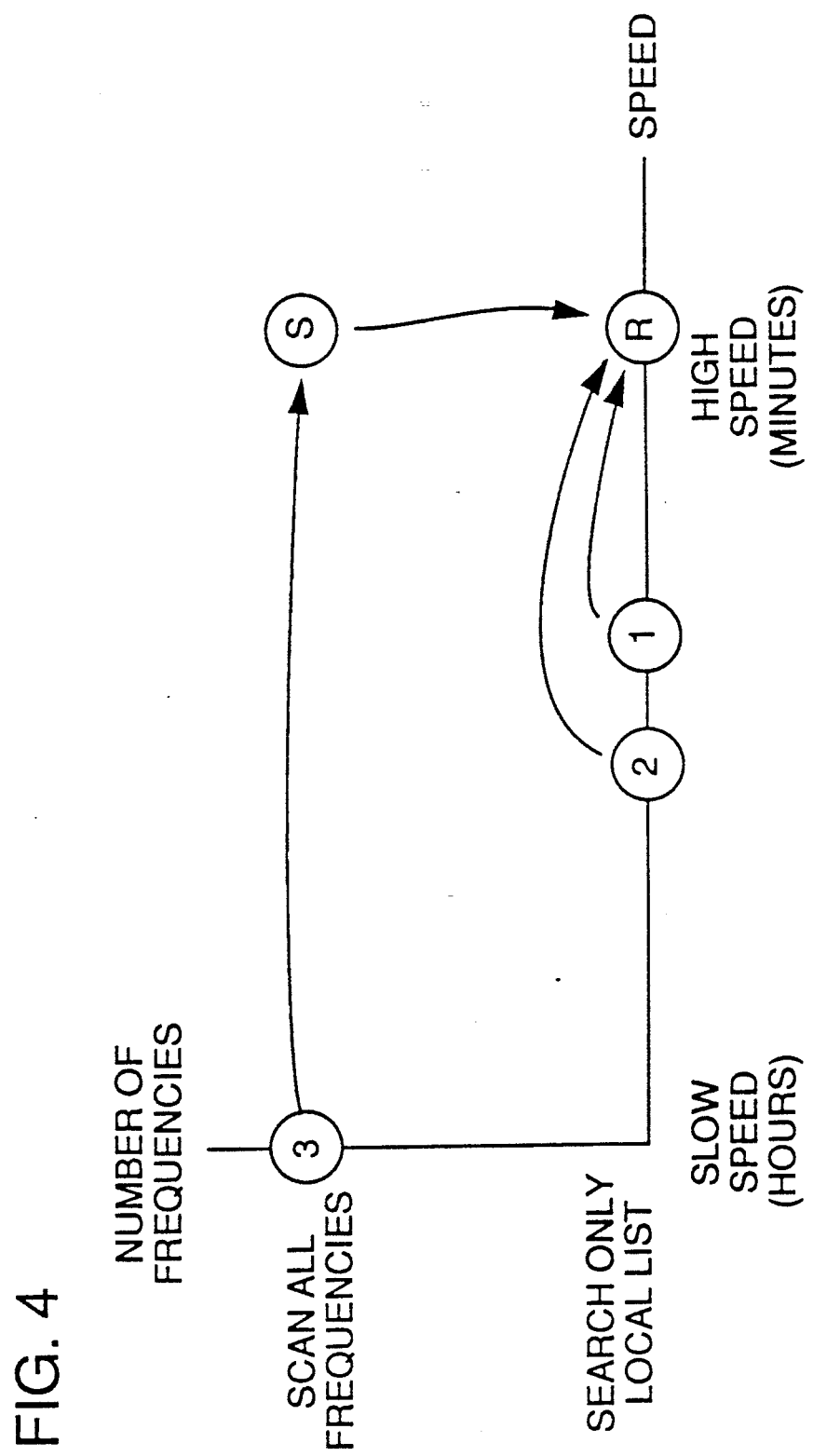
FIG. 4 is a state diagram illustrating various operational states of the paging receiver of FIG. 2.

The system operates in accordance with the sequence of states shown in FIG. 4. With respect to the operations that are relevant to an explanation of the present invention, the pager operates in one of the states "S", "1", "2", "3", or "R" as explained below.

State S (start): When the pager is turned "on", it begins a high speed scan of all frequencies until a signal is found or until three minutes expire.

If a signal is found during the S state, the pager goes to state 1.

If no signal is found after 3 minutes the system goes to state 3.

State 1: This is the normal mode where the pager turns on every 1.875 minutes to receive a packet.

If the pager receives a good packet when it turns on, the cycle continually repeats every 1.875 minutes.

If the station does not receive a good packet it goes through all stations in the local list within 1.875 minutes.

If the pager does not receive a good packet after going through the list four times, the pager goes to state 2.

State 2: In this mode the pager searches the local list at a moderate speed. It searches one station on the local list each 1.875 minutes (thereby requiring more time to go through the entire local list than in state 1).

If the pager receives a packet it returns to state 1.

If a pager does not receive any signals after about 1.5 to 2 hours it goes to state 3.

State 3: In this state the pager does a very slow scan of all frequencies.

If the pager does receive a packet it goes to state 1.

State R: This is the "registration" mode which is the subject of this invention (see FIG. 5). The system enters registration mode when the "Registration" button is pushed. In this mode the watch does a high speed search of all stations on its local list; however, If the pager is in mode S when the R button is pushed, it will continue to scan all frequencies at high speed until it finds a frequency with a signal containing the pager's protocol. If it does not find such a signal in 30 minutes, the pager goes out of registration mode and returns to mode 3.

If the pager is in mode 3 when the R button is pushed, the pager goes to mode S and the actions described above for mode S are initiated.

As explained above and shown in FIG. 5, the pager performs:

(a) one set of actions if the R button is pushed when the the pager is in modes 1 or 2 where it already has a list of frequencies of the local stations in its memory and, (b) a second set of actions when the R button is pushed while the pager is in modes 3 or S where the pager does not have in its memory a set of frequencies of the local stations. When the pager does not have a local list in memory, that is, when it is not receiving information packets, the pager must scans through the entire relevant frequency spectrum at a fast rate until it finds a frequency that has the desired protocol. Once it finds an appropriate frequency it will receive an initialization packet and then switch into the mode of operation similar to the actions taken when it enters registration mode from modes 1 or 2. Providing the pager with a separate registration mode provides a unique combination which is greatly advantageous.

The following is a more detailed explanation of the operation of the system: The paging signals received by the receiver 14 are formatted as sequences of packets. The first three packets of each sequence are termed "control" packets. The first of the control packets is termed the "control 0" packet and contains the date and time and the first entry of the channel list. The second packet is termed the "control 1" packet and contains the other entries in the channel list. The third packet is a spare. These three control packets are followed by 1024 "data" packets in which the paging data is transmitted. Subsequent sequences are similarly formatted. A new sequence (or "subframe") of 1027 packets is transmitted every 14.0625 seconds.

When a paging receiver is newly-energized, it first begins a spectrum-wide scan for a station carrying the paging data. When such a station is found, the receiver decodes the first and second packets and stores the local channel list contained therein into microprocessor memory 24. Thereafter, the receiver continues to operate on the original channel until there is a failure in reception, such as receipt of a packet with uncorrectable errors. When such an event occurs, the receiver searches among other channels in the local list until good data is again received.

When the paging receiver is newly energized it goes into the S mode. In the S Mode the microprocessor 22 causes the frequency agile receiver 18 to begin a fast scan of the entire FM broadcast spectrum, 88.1 to 107.9 MHz in increments of 0.2 MHz, until a channel with paging data is located. When such a channel is located, the receiver reads the local channel list transmitted in the control 0 and control 1 packets thereof and stores the list in memory 24. Thereafter, the receiver is in the "1" mode and the receiver momentarily energizes once every 1.875 minutes to listen for paging messages directed to the receiver's user. 18 As long as reception on this channel continues to be reliable, the receiver stays in this low energy mode of operation, simply listening periodically for paging messages.

If the user moves the receiver 14 to a new location in which reception is impaired, the receiver will detect the loss of paging data utilizing a CRC error. This error prompts the microprocessor 22 to begin a search through the channels listed in the local channel list for an alternative source of paging signals. The transmission on these channels are generally all time-staggered relative to one another, so the receiver can tune to the first alternative channel for a given frame of information and, if unsuccessful, can tune to the next alternative channel, and so forth, all within the frame period of 1.875 minutes. In the illustrated embodiment, this search continues for four complete cycles through the local channel list (i.e., maximum period of 7.5 minutes) looking for paging data.

If the receiver's loss of the original signal was caused by some transitory effect, such as a momentary incident of multipath while the user drove between buildings in a downtown area, the receiver quickly resumes reception of paging signals, generally without loss of a single message since each channel transmits each message in time-staggered relation. If, however, the receiver has not reacquired a paging signal within this 7.5 minute search time, the microprocessor presumes the signal loss is not of momentary duration and ceases the receiver's relatively high energy search operation. (If there are seven stations in the local channel list, the energization of the receiver seven times every 1.875 minutes during this operation consumes power at a rate of seven times that consumed during normal operation, in which the receiver is energized only once every 1.875 minutes.)

If the search proceeds for 7.5 minutes with no results, the microprocessor concludes that the loss of signal is not merely transitory, and the system goes to mode 2 where it continues its searching though the local channel list, but at a slower rate, such as one channel every 1.875 minutes. This operation consumes power at the same rate as the normal receiving mode of operation, yet concentrates the search among the channels most likely to be carrying paging signals. In the illustrated embodiment, this slower searching mode continues for a considerable period (i.e. 1.5 to 2 hours).

If no paging signal is located using the above procedures, the system goes to mode 3 and the microprocessor instructs the frequency agile receiver to institute a spectrum-wide scan for paging data. This scan is desirably conducted at a relatively slow rate, such as one channel every 1.875 minutes, to conserve battery power. If desired, the microprocessor can be programmed to begin this mode of operation with one fast scan through the spectrum, and thereafter continue the scan at the more relaxed pace. This low energy scan continues until a paging signal is finally found.

By the foregoing arrangement, a paging receiver is able to quickly recover from transitory conditions that render a particular transmission unreliable simply by switching to another of the channels previously identified in the local channel list. If a signal failure cannot be quickly cured by resort to one of these other channels, the receiver reduces battery drain by searching among the listed channels more slowly. If this limited search continues to prove unavailing, the receiver begins scanning the entire spectrum, but at a rate that consumes little battery energy. Thus, the battery energy is expended where it is most likely to do the most good, with a high energy search among the most likely channels and a progressively lower energy search or scan as the likelihood of quickly finding a station diminishes.

The registration button will normally be pushed sometime after the receiver has been activated in the S state. Thus when the registration button is pushed the receiver may be in anyone of the states. However, when the registration button is pushed the receiver will go into the R state and do a fast search (if it was in state 1 or 2) or do a fast scan (if it was in state 3 or S). As previously explained, the paging receiver 14 is programmed during manufacture with an identification code. In some embodiments, this code may be hardwired into the circuitry, while in others the code may be stored in the memory 24 and subsequently changed if desired. The receiver is also provided with a "registration mode" subroutine in its memory 24 (FIGS. 2, 3). This subroutine is executed by the receiver microprocessor 22 in response to a command entered by the user through the user interface 26. In the illustrated embodiment, this command takes the form of the user depressing a button 30 and holding it in the depressed position for approximately five seconds.

Upon initiation of the registration mode subroutine, the microprocessor first polls its memory 24 to retrieve the identification code and displays this code on an alphanumeric display 32 associated with the receiver's user interface 26. The receiver then begins rapidly searching or scanning through a list of candidate paging channels depending upon its previous state.

Once the identification code has been displayed on the display 32, the user telephones the paging system clearinghouse 10 and, by a series of Touch-Tone commands, enters the paging receiver's identification code into the clearinghouse computer. Additional information, such as a credit card number for billing purposes may also be provided in this fashion.

In response to successful entry of this data into the clearinghouse computer, the clearinghouse relays a request to the paging system transmitters 12 (which are often located remotely from the clearinghouse) instructing the transmitters to send an initialization message addressed to the newly registered pager. Included in this message may be certain initialization data, such as a list of alternative frequencies on which the paging data may be found. The pager quickly receives this message (due to its rapid scanning operation) and stores any initialization data in data registers or other portion of its memory 24 for future reference. The pager then displays a message to the user confirming the pager's proper operation. Thereafter, the pager resumes its normal operation, energizing only periodically and listening for messages addressed with its identification code.

As previously noted, the pager either goes into a fast scan or into a fast search mode when the R button is pushed. The registration mode must be understood in the context of the pager's other searching/scanning operations shown in FIG. 4. It is noted that a pager may have more modes than shown in FIG. 4. The various modes (other than the registration mode) shown in FIG. 4 are not of themselves part of the present invention.

As detailed in the earlier-referenced copending applications, in the pager's normal mode of operation (referred to herein as mode 1), the pager energizes approximately every 1.875 minutes and monitors a single channel. The second mode illustrated in FIG. 4 corresponds to a rapid search once through all the channels in the local channel list. The pager switches into this second mode if reception of paging data on the single channel monitored in the first mode becomes unreliable.

The third mode illustrated in FIG. 4 corresponds to a slow scan repeated through all of the relevant frequency spectrum until a signal carrying paging data is again found. The pager lapses into this third state if the repeated search of the second mode fails to locate a paging signal within one and a half to two hours.

The S (or start) mode illustrated in FIG. 4 corresponds to a fast scan through the entire relevant frequency spectrum to locate a channel carrying the paging protocol. The pager operates in this mode on initial power up, or when a button on the user interface is operated to quickly locate a new paging station.

Figure 5:
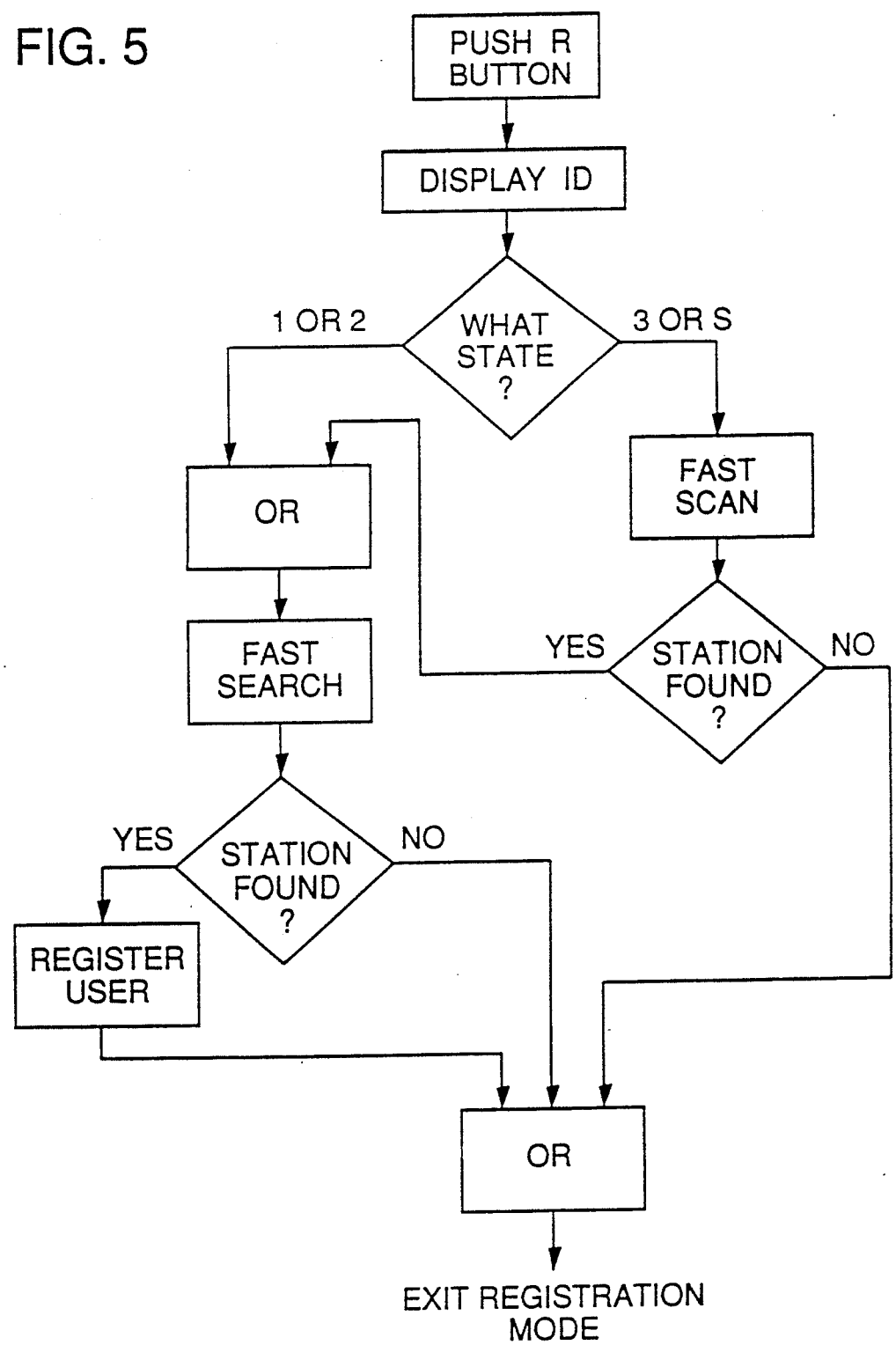
FIG. 5 is a flow diagram of the registration operation.

The registration mode of operation used in the preferred embodiment of the present invention is shown in FIG. 5 and indicated by the "R" in FIG. 4. If the pager was in modes 1, or 2 when it is placed into registration mode, the pager searches through the local list looking for a packet of paging data every 14 seconds. If it finds a packet it stays in this mode until it receives an initialization message or for 5 minutes. After 5 minutes the pager automatically exits from the registration mode. Five minutes is established as the maximum time which it should take the central station to send an initialization message. Naturally this time could be made longer or shorter as needed.

If the pager is in mode S or mode 3 when the R button is pushed, the pager first does a fast scan of the entire frequency spectrum to find a station which is broadcasting the paging protocol. If it finds such a station, the pager performs the same as if the R button had been pushed when the pager was in modes 1 or 2. If the pager does not find a station which is broadcasting the paging protocol, after 30 minutes it goes out of registration mode and returns to mode 3.

Naturally, it should be understood that the system can include additional modes beyond those described herein. The modes described herein were selected for discussion to provide a context for describing the present invention.

From the foregoing, it will be recognized that a pager according to the present invention overcomes the disadvantages of the prior art and greatly simplifies the process by which a paging receiver is registered with a paging system.

Having described and illustrated the principles of our invention with reference to a preferred embodiment thereof, it will be apparent that the invention can be modified in arrangement and detail without departing from such principles. Accordingly, we claim as our invention all such modifications as may come within the scope and spirit of the following claims and equivalents thereto.

We claim:

1. A method of operating an intermittently operative pager which receives paging data broadcast from a transmitter, said pager having operative and inoperative periods under normal paging operation, the inoperative periods being substantially greater than the operative periods in order to increase battery life, the data being routed to the transmitter from a message input facility, the method comprising the steps:

placing the pager in the possession of a user remote from said transmitter;

providing a manual stimulus by said user to the pager to place said pager in a registration mode wherein registration mode inoperative periods of said pager are relatively short as compared to said inoperative periods of normal paging operation, and to obtain a registration code previously stored within the pager;

contacting said message input facility by said user and providing the registration code thereto to identify pager;

relaying from the message input facility to said transmitter, and broadcasting from the transmitter to the pager, a registration message addressed to the pager;

receiving the registration message by the pager; and displaying on the pager an indication to said user that the registration message was received.

2. The method of claim 1 including the step of displaying on said pager, in response to said manual stimulus, a registration code that identifies the particular pager.

3. The method of claim 1 which further comprises tuning the pager to a plurality of channels to locate a channel carrying paging data.

4. An intermittently operative radio pager which receives paging data broadcast from a transmitter, said pager having normal paging operative and inoperative periods in order to increase battery life, including:

means for providing a manual user stimulus to the pager to place said pager in a registration mode wherein registration mode inoperative periods of said pager are relatively short as compared to said normal paging inoperative periods, and to obtain from said pager an identification code previously stored within said pager whereby a user may use said code to initiate transmission of an initialization message by said transmitter;

means in said pager for receiving the initialization message from said transmitter;

means for displaying on said pager an indication that the initialization message was received.

5. The pager of claim 4 wherein said pager has a registration number and said pager includes means for displaying said registration number in response to said manual stimulus.

* * * * *